United States Patent

Shigezane et al.

[11] Patent Number: 5,831,434
[45] Date of Patent: Nov. 3, 1998

[54] SAMPLE TUBE FOR NUCLEAR MAGNETIC RESONANCE APPARATUS

[75] Inventors: Masahiro Shigezane, Hachioji; Seizo Takahashi, Tokyo, both of Japan

[73] Assignee: Shigemi Co. Ltd., Tokyo, Japan

[21] Appl. No.: 872,755

[22] Filed: Jun. 11, 1997

Related U.S. Application Data

[63] Continuation of Ser. No. 268,025, Jun. 29, 1994, abandoned.

[30] Foreign Application Priority Data

Jun. 30, 1993 [JP] Japan ................................. 5-187002

[51] Int. Cl.$^6$ .............................. G01V 3/00; G01V 3/14
[52] U.S. Cl. ........................................ 324/321; 324/322
[58] Field of Search ................... 324/307, 309, 324/318, 321, 322

[56] References Cited

U.S. PATENT DOCUMENTS

| | | | |
|---|---|---|---|
| 4,052,661 | 10/1977 | Higham et al. | 324/322 |
| 4,549,136 | 10/1985 | Zens | 324/308 |
| 5,573,567 | 11/1996 | Shigezane | 65/108 |

FOREIGN PATENT DOCUMENTS

| | | |
|---|---|---|
| 0188368 | 7/1986 | European Pat. Off. . |
| 0285853 | 10/1988 | European Pat. Off. . |
| 0547918 | 6/1993 | European Pat. Off. . |
| 3314926 | 10/1984 | Germany . |
| 4031994 | 11/1992 | Germany . |
| 60-10833 | 6/1985 | Japan . |
| 60-33771 | 8/1985 | Japan . |
| 61-24886 | 10/1986 | Japan . |
| 63-53998 | 3/1988 | Japan . |
| 63-53999 | 3/1988 | Japan . |
| 293775 | 7/1990 | Japan . |

OTHER PUBLICATIONS

S. Takahashi et al. "A Novel NMR Microcell . . . " Journal of Magnetic 76, 347–351 (1988) No. 2, Duluth, MN, USA. pp. 347–351.
S. Takahashi et al. Jeol News, vol. 27, (No. 2–2), 32 (1987) pp. 32–34.
S. Takahashi et al. "Micro Cell for NMR Instrument", (1986), JP S61–248866.
S. Takahashi et al. "Tube for NMR Measurement" (1988), JP S63–53999.
A. P. Zens, "Controlled Susceptibility Plugs", US Pat. 4,549, 136 (1985).
Wilmad Resonance Report, vol. 8, (1990) 4 pgs.
S. Takahashi et al. Proceeding of 26$^{th}$ Annual Discussion of Meeting of Nuclear Magnetic Resonance (Japan) pp. 67–70 (1987).
S. Takahashi, "Sample Pipe for Nuclear . . . " Abortive U.S. patent application, SG. 401 (1992).
MS–003, Shigemi Catalogue, P6 (1975) pp. 1–14.
S. Takahashi, et al. "Sample Tube for NMR Measurement" (1988) JP S63–53998.
Wilmad Resonance Report, NMR009 3 pgs.

Primary Examiner—Sandra L. O'Shea
Assistant Examiner—Mack Haynes
Attorney, Agent, or Firm—Ladas & Parry

[57] ABSTRACT

A sample tube for the use in a nuclear magnetic apparatus comprising a sample tube, said sample tube being formed of a glass substance, wherein the magnetic susceptibility of said glass substance has been adjusted by incorporating therein a sufficient amount of one or more paramagnetic and/or diamagnetic substances so as to impart to said sample tube a magnetic susceptibility proximate to that of a liquid sample to be tested.

6 Claims, 1 Drawing Sheet

SAMPLE TUBE FOR NUCLEAR MAGNETIC RESONANCE APPARATUS

This application is a continuation of application Ser. No. 08/268,025 filed on Jun. 29, 1994, now abandoned.

BACKGROUND OF THE INVENTION

1. Field of the Invention

This invention relates to a nuclear magnetic resonance (NMR) apparatus used in the field for analyzing a sample of small volume and/or low concentration with the use of a superconducting magnet, and more specifically to a sample tube suitable to be used in a nuclear magnetic resonance apparatus.

2. Brief Description of the Prior Art

In the case where a sample is analyzed with the use of a superconducting magnet, that is, one having an observation frequency for the NMR apparatus of from 100 MHz to 600 MHz, the sample tube itself should not disturb the uniformity of the magnetic field. Therefore, the sample tube has heretofore been made of a hard glass material with excellent anti-corrosion and heat resistance properties, such as, for example, a borosilicate glass or a special hard glass. With such superconducting magnets, the sample tube is generally positioned with its longitudinal axis positioned parallel to the direction of the magnetic field.

However, as the observation frequency of the nuclear magnetic resonance apparatus has increased with the progress of superconducting technique, one cannot disregard the effect on special resolution due to a difference in magnetic susceptibility between a sample (sample solvent) and a sample tube. That is, if the difference in magnetic susceptibility between the sample and the sample tube is significant, homogeneity of the magnetic field at that portion contacting the sample tube is disturbed. It is also known that as the measuring magnetic field is increased, these differences in magnetic susceptibility will affect the resolution of the spectrum. According to a test, it becomes clear that if the magnetic susceptibility differs by 10% between the glass and the solution, the magnetic field at the boundary portion is so disturbed that it cannot be corrected by so-called shim coils.

OBJECT AND SUMMARY OF THE INVENTION

It is therefore an object of the present invention to provide a nuclear magnetic resonance apparatus, in which the difference in magnetic susceptibility between a sample and a sample tube is decreased so that a high resolution can be obtained even in the case where a superconducting magnet is used.

In the broadest aspect of the invention a sample tube used in a nuclear magnetic resonance apparatus is constructed by using a glass composition which has a magnetic susceptibility proximate to that of the sample. To accomplish the invention the magnetic susceptibility of the glass composition is adjusted by incorporating a calculated amount of a paramagnetic substance and/or a diamagnetic substance. In particular, the glass composition is formulated by mixing a corresponding amount of a paramagnetic substance and/or a diamagnetic substance to compensate for the difference in magnetic susceptibility taking into account adjustment due to chemical reaction or the like.

The invention is carried out as follows.

According to the invention a glass substance is formed such that the magnetic susceptibility is proximate to the magnetic susceptibility of the sample solvent, and then the sample tube is made using such obtained glass substance. Accordingly, since the difference in magnetic susceptibility between the sample solvent and the sample tube is minimized and the magnetic field at that portion contacting the sample tube is homogeneous, a high resolution spectra can be obtained even in the case where a superconducting magnet is used.

After the magnetic susceptibility of the glass material to be used and that of the solvent for the sample are noted and the difference in said magnetic susceptibilities determined, there is calculated the amount of paramagnetic substance (for example, iron, nickel, cobalt, or the like, or oxides thereof) and/or diamagnetic substance in order to make a glass substance in which the magnetic susceptibility is proximate to the magnetic susceptibility of the sample solvent. Thereafter, the sample tube is made using such obtained glass substance and its magnetic susceptibility determined to see that the desired magnetic susceptibility has been achieved.

The paramagnetic and/or diamagnetic materials are selected, mixed together and melted, and then rapidly cooled to minimize the generation of crystalline material, thereby making a glass substance which is small in anisotropy and adjusted to have a proximate magnetic susceptibility to that of the sample solvent, and thereafter the sample tube is made using such obtained glass substance. Accordingly, a high resolution can be obtained by minimizing the difference in magnetic susceptibility between the sample solvent and the sample tube.

The above and other objects, features and advantages of the present invention and the manner of realizing them will become more apparent, and the invention itself will best be understood from a study of the following description and appended claims with reference to the attached drawings showing one preferred embodiment of the invention.

DETAILED DESCRIPTION OF THE EMBODIMENTS

Figures 1, 2, 3, 4:
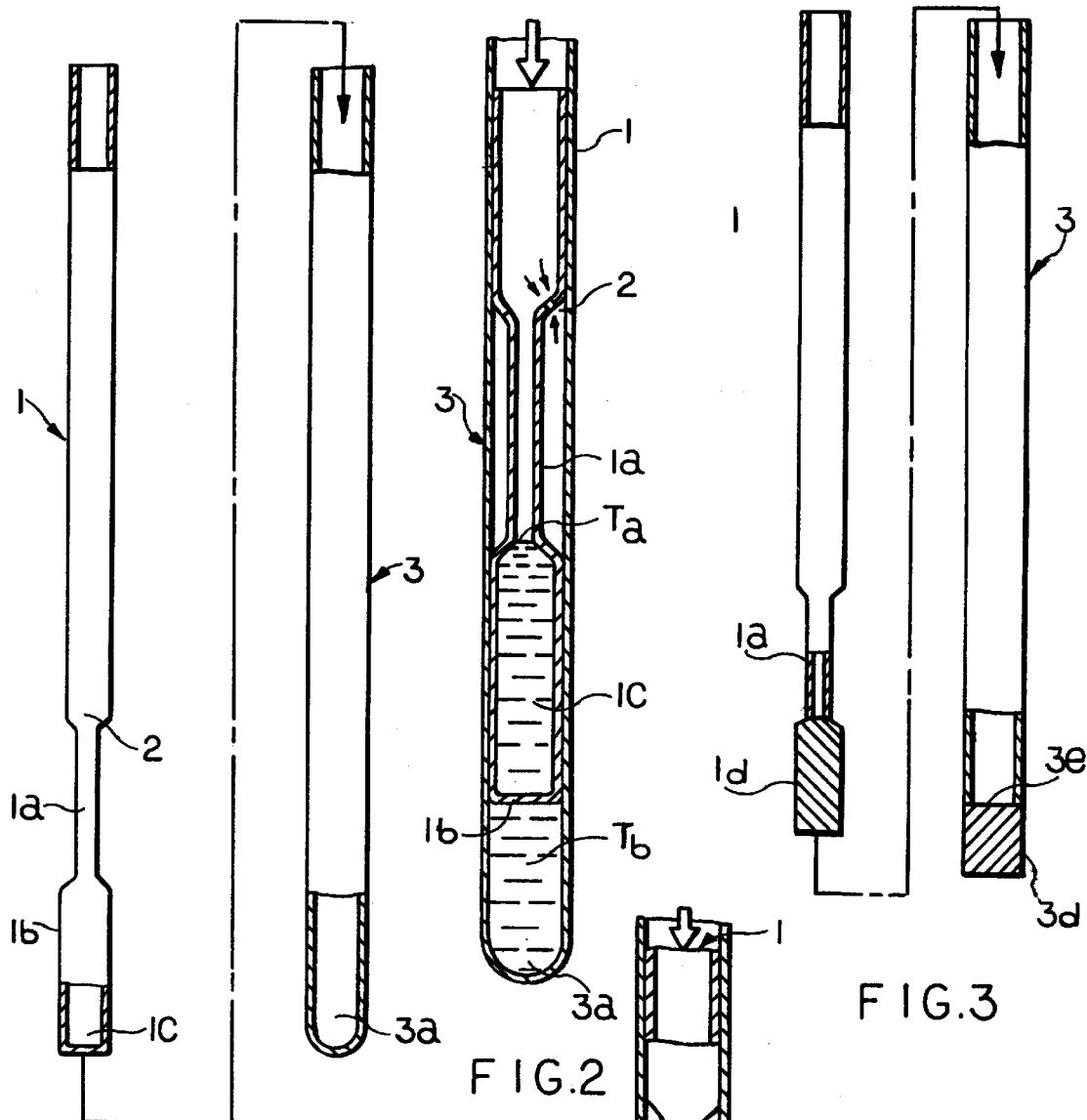
FIG. 1 is a front sectional view, partly omitted, of a sample tube for the use in a nuclear magnetic resonance apparatus according to one embodiment of the present invention, in which an exploded view of an inner tube and an outer tube is shown.
FIG. 2 is an enlarged sectional view of an important portion, showing an example of use of the sample tube of FIG. 1.
FIG. 3 is likewise a front sectional view, partly omitted, of a sample tube for the use in a nuclear magnetic resonance apparatus according to another embodiment of the present invention, in which an exploded view of an inner tube and an outer tube is likewise shown.
FIG. 4 is an enlarged sectional view of an important portion, showing an example of the use of the sample tube of FIG. 3.

Preferred embodiments of a sample tube for the use in a nuclear magnetic resonance apparatus according to the present invention will be described in detail with reference to the accompanying drawings.

For manufacturing a sample tube, first, the components of elements contained in the material of the glass are analyzed and a magnetic susceptibility is calculated from the ratio of amounts assuming that all of the elements will be oxides or particular compounds. One also takes into account impure substances which may be mixed into the glass material during the process of manufacturing the glass as originating from the apparatus, and their contribution to the magnetic susceptibility is calculated. Then, the magnetic susceptibility of the solvent as the significant component of a sample in determining the magnetic susceptibility of the solution is compared with the magnetic susceptibility of the glass substance to obtain a difference therebetween. By incorporating and melting metal compounds which are expected to exhibit a corresponding amount of a paramagnetic and/or diamagnetic property to compensate for the difference, a glass substance having a magnetic susceptibility proximate to that of the sample solvent is made. Then, a sample tube is manufactured using such obtained glass substance.

Any metal compound may be used as long as it exhibits an intended paramagnetic or diamagnetic property. Acceptable examples include various kinds of elements, ions, inorganic compounds, complex compounds, organic compounds, and stable radicals. In general, it is known through tests that the magnetic susceptibility is preferably adjusted by transition metals showing a paramagnetic property such as, for example, iron, nickel, cobalt, or the like, or oxides thereof. Suitable diamagnetic materials include $B_2O_3$, $Sb_2O_3$, $La_2O_3$, $ZnO$, $SiO_2$, and $Mo_2O_3$.

As the solvent for the sample, water, chloroform, acetone, alcohol, etc. are used. It is also known through tests that, for a water solvent, a borosilicate glass containing an iron portion of 400 ppm to 600 ppm is most preferably used in order to calculate the magnetic susceptibility and to make an adjustment within ±5 percent of the magnetic susceptibility of the sample solvent. The preferred difference in magnetic susceptibility between the glass and the sample solvent is ±2 percent. Moreover, as the glass substance, anything may be used as long as it does not exhibit an anisotropic effect on magnetic susceptibility. It is also known through tests that not only such inorganic substances as ceramics but also such organic substances as plastics or synthetic rubber may be used.

Next, the construction of a sample tube for the use in a nuclear magnetic resonance apparatus, which is made of a glass substance in which the magnetic susceptibility is adjusted in the manner as above mentioned, will be described with reference to FIGS. 1 and 2.

FIG. 1 is a partly sectional front view, showing an inner tube 1 and an outer tube 3 in which the inner tube 1 can be fitted. A reduced diameter tubular portion 1a is formed in an intermediate portion on a lower end of the inner tube 1. A receiving chamber 1c for receiving a sample solvent Ta (see FIG. 2) is defined within a lower tubular portion 1b and is underneath the reduced diameter tubular portion 1a.

Reference 2 denotes a communication hole formed in an upper end inclined surface portion of the reduced diameter tubular portion 1a. In FIG. 2, reference numeral 3a denotes a receiving chamber for receiving a sample solution Tb. The receiving chamber 3a is constructed within a lower end of the outer tube 3 by fitting the inner tube 1 into the outer tube 3.

For measuring the sample using the inner tube 1 and the outer tube 3 which are formed of a glass substance, whose entirety is adjusted in magnetic susceptibility, first, the sample solution Tb is charged into the receiving chamber 3a of the outer tube 3. Then, as shown in FIG. 2, the inner tube 1 is fitted into the outer tube 3 and correctly positioned in accordance with the amount of sample solution Tb. In order to eliminate the air bubbles trapped underneath 1b, the inner tube 1 is inserted further into the outer tube 3 to push the sample solution Tb up to an area near the communication hole 2 so that the air bubbles can be pushed out through the communication hole 2 into 1c. An additional sample solvent Ta is then charged into the inner tube 1 until the Ta and the air bubble levels are above the communication hole 2. Finally, after the inner tube 1 is withdrawn to the original position, the sample solvent Ta of the inner tube 1 will flow into the outer tube 3 through the communication hole 2 due to pressure differences. Therefore, the inner and outer sample solvent Ta and sample solution Tb can easily be mixed with each other.

FIGS. 3 and 4 show another embodiment of the present invention. A lower part of a reduced diameter tubular 1a of an inner tube 1 which is formed of a normal glass substance serves as an inner core portion 1d which is formed of a glass substance having a magnetic susceptibility proximate to that of the above-mentioned sample. Similarly, a bottom portion of an outer tube formed of an ordinary glass substance serves as an outer core portion 3d which is formed of the same glass substance as the inner core portion 1d of the inner tube 1. For fitting the inner tube 1 into the outer tube 3, as shown in FIG. 4, first, a sample solution Tc is received in an upper receiving chamber 3e of the outer core portion 3d of the outer tube 3 and then, the inner tube 1 is fitted into the outer tube 3 such that the sample solution Tc is sandwiched between the substantially flat surface of inner core portion 1d and the substantially flat surface of outer core portion 3d. By doing this, one can minimize the difference in magnetic susceptibility of the sample tube comprising the sample solution Tc, the inner tube 1, and the outer tube 3.

Since the sample tube for the use in a nuclear magnetic resonance apparatus according to the present invention has a small difference in magnetic susceptibility between the sample and the sample tube, the magnetic field at that portion contacting the sample tube can be adjusted to obtain homogeneity. Therefore, a high resolution can be exhibited and an excellent analyzing effect can be obtained even in the case where a superconducting magnet is used.

EXAMPLE

A resonance signal of residual water in deuterated water was used as a model solution of aqueous sample for constructing a sample tube for use in NMR. The magnetic susceptibility of the solvent is noted to be −12.76. The glass composition to be used in producing the sample tube was a borosilicate hard glass, having the following composition.

| | |
|---|---|
| $SiO_2$ | 77% |
| $B_2O_3$ | 13% |
| $Na_2O$ | 7% |

The magnetic susceptibility of such a composition was calculated to be −29.25 using Pascal's formula.

In order to adjust the magnetic susceptibility to be within the range of ±5% of that of the sample solvent, 480 ppm of ferric oxide was added to said borosilicate hard glass composition. Since the standard method, namely Gouy method, to measure the magnetic susceptibility was not sufficiently accurate, the glass was formed in a shape of tube shown in FIGS. 1 & 2, and the line shape of residual water resonance was measured by nuclear magnetic resonance. It was assumed that the magnetic susceptibility fell well within the range of ±5% when the line shape became symmetric and the half-height line width fell within 0.5 Hz by adjusting the current of so-called shim coil. It was considered that the effect of the solute sample on the magnetic susceptibility of the resulting solution being analyzed was negligible.

NMR measurement was carried out in three steps for developing this glass.

1. Glass was grounded and packed in a conventional NMR tube. Then, it was immersed in deuterated water and the line width measured to select the best composition.
2. The selected glass was formed in the shape of a glass rod and inserted in a conventional NMR tube and the line shape of residual water resonance was measured to make sure that the effect of the glass was adjustable by shim coil currents. If necessary, the glass was further selected from several lots.
3. Finally, the glass was formed in the shape of an NMR tube as shown in FIGS. 1 and 2. All of the new glass tubes were checked by NMR as to whether they were within the range of the criteria set for the line shape. These criteria include a number of factors and cannot be describable as numerical values.

Another aspect of the invention relates to an array of sample tubes for use in nuclear magnetic resonance apparatus, said sample tubes being made from a glass material, in which the glass tubes have different degrees of magnetic susceptibility so as to be suitable for selection for use with sample solutions having solvents of differing given magnetic susceptibilities, said sample tubes having been made by incorporating therein sufficient amounts of one or more paramagnetic and/or diamagnetic substances so as to have magnetic susceptibilities proximate to those of the respective solvents. The detailed description above is also applicable to this aspect of the invention. Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodied within a scope encompassed and equivalents thereof with respect to the feature set out in the appended claims.

We claim:

1. A sample tube for use in a nuclear magnetic apparatus, said sample tube comprising:

an outer glass tube having an open end, a closed end, an outer surface and an inner surface, and an inner glass tube of reduced diameter adapted to move axially in sliding relationship to the inner surface of the outer glass tube, said outer glass tube having at its closed end an outer core portion of a glass substance having adjusted magnetic susceptibility, said core portion having a substantially flat surface facing the open end of the outer glass tube, said inner glass tube having at its distal end facing the closed end of the outer tube an inner core portion of a glass substance having adjusted magnetic susceptibility, the end of said inner core portion facing the closed end of the outer tube also being substantially flat, whereby said opposing core portions define therebetween and with the adjacent inner walls of the outer tube a sample chamber for containing a sample solution, and the glass composition of adjusted magnetic susceptibility of said inner and outer core portions having been adjusted by incorporating therein a sufficient amount of one or more paramagnetic substances so as to impart to each of said core portions a magnetic susceptibility proximate to that of a liquid sample being tested.

2. A sample tube according to claim 1, in which the paramagnetic substance is a metal selected from the group consisting or iron, nickel and cobalt or an oxide of one of said metals.

3. A sample tube according to claim 1, in which the magnetic susceptibility of the glass composition differs no more than 5 percent from the magnetic susceptibility of the sample solvent.

4. A sample tube according to claim 1, in which the outer glass tube is formed from an ordinary glass substance.

5. A sample tube according to claim 4, in which the inner glass tube is formed from an ordinary glass substance.

6. An array of sample tubes for use in nuclear magnetic resonance apparatus, said sample tubes being made from a glass material, in which each of said glass tubes has inner and outer core portions of glass of matching degrees of magnetic susceptibility as defined in claim 1 and each tube has said matching core portions of a different degree of magnetic susceptibility so as to be suitable for selection for use with sample solutions having solvents of differing given magnetic susceptibilities.

* * * * *